(12) United States Patent
Lai

(10) Patent No.: US 9,886,901 B2
(45) Date of Patent: Feb. 6, 2018

(54) PIXEL UNIT STRUCTURE OF ORGANIC LIGHT EMITTING DIODE DISPLAY PANEL AND DRIVING MECHANISM THEREOF

(71) Applicant: HON HAI PRECISION INDUSTRY CO., LTD., New Taipei (TW)

(72) Inventor: Chung-Wen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 95 days.

(21) Appl. No.: 14/820,135

(22) Filed: Aug. 6, 2015

(65) Prior Publication Data

US 2016/0148575 A1    May 26, 2016

(51) Int. Cl.
G09G 3/32      (2016.01)
H01L 27/32     (2006.01)
G09G 3/3233    (2016.01)

(52) U.S. Cl.
CPC ... *G09G 3/3233* (2013.01); *G09G 2300/0819* (2013.01); *G09G 2300/0842* (2013.01); *G09G 2300/0861* (2013.01); *G09G 2320/045* (2013.01); *H01L 27/3276* (2013.01)

(58) Field of Classification Search
CPC .. G09G 3/3208; G09G 3/3225; G09G 3/3233; G09G 3/3241; G09G 2300/0482; G09G 2300/0852; G09G 2300/0861; G09G 2320/04; G09G 2320/043; G09G 2320/045
See application file for complete search history.

(56) References Cited

U.S. PATENT DOCUMENTS

| | | | |
|---|---|---|---|
| 2007/0040772 A1* | 2/2007 | Kim | G09G 3/3233 345/76 |
| 2008/0088547 A1 | 4/2008 | Chan et al. | |
| 2013/0069537 A1* | 3/2013 | Sun | G09G 3/3233 315/123 |
| 2014/0320550 A1* | 10/2014 | Liao | G09G 3/3225 345/690 |
| 2015/0070407 A1* | 3/2015 | Lee | G09G 3/3233 345/690 |
| 2015/0221255 A1* | 8/2015 | Qing | G06F 3/0412 345/173 |

FOREIGN PATENT DOCUMENTS

TW     200802282 A     1/2008

* cited by examiner

*Primary Examiner* — Benjamin C Lee
*Assistant Examiner* — Dong Hui Liang
(74) *Attorney, Agent, or Firm* — ScienBiziP, P.C.

(57) ABSTRACT

A pixel unit structure of an organic light emitting diode display panel includes a switch transistor, a storage capacitor configured to receive a discharging reference voltage, an organic light emitting diode, a driving transistor, a first control circuit, and a second control circuit. The organic light emitting diode is controlled by the driving transistor and the first control circuit to emit light. The scan signal, the first control signal, the second control signal, and the discharging reference voltage control the pixel unit to operate in a plurality of time events repeating in sequence.

8 Claims, 6 Drawing Sheets

PIXEL UNIT STRUCTURE OF ORGANIC LIGHT EMITTING DIODE DISPLAY PANEL AND DRIVING MECHANISM THEREOF

FIELD

The subject matter herein generally relates to organic light emitting diode (OLED) display panels, and more particularly to an OLED pixel unit structure and driving means of the OLED pixel unit.

BACKGROUND

Generally, organic light emitting diodes (OLED) used in OLED display panels are classified as active matrix OLEDs (AMOLEDs) or passive matrix OLEDs (PMOLEDs). AMOLED display panels may include a driving transistor and a storage capacitor. The storage capacitor stores a data signal. The driving transistor provides a driving current to the OLED to emit light according to the data signal stored in the storage capacitor.

BRIEF DESCRIPTION OF THE DRAWINGS

Implementations of the present technology will now be described, by way of example only, with reference to the attached figures.

DETAILED DESCRIPTION

Figure 1:
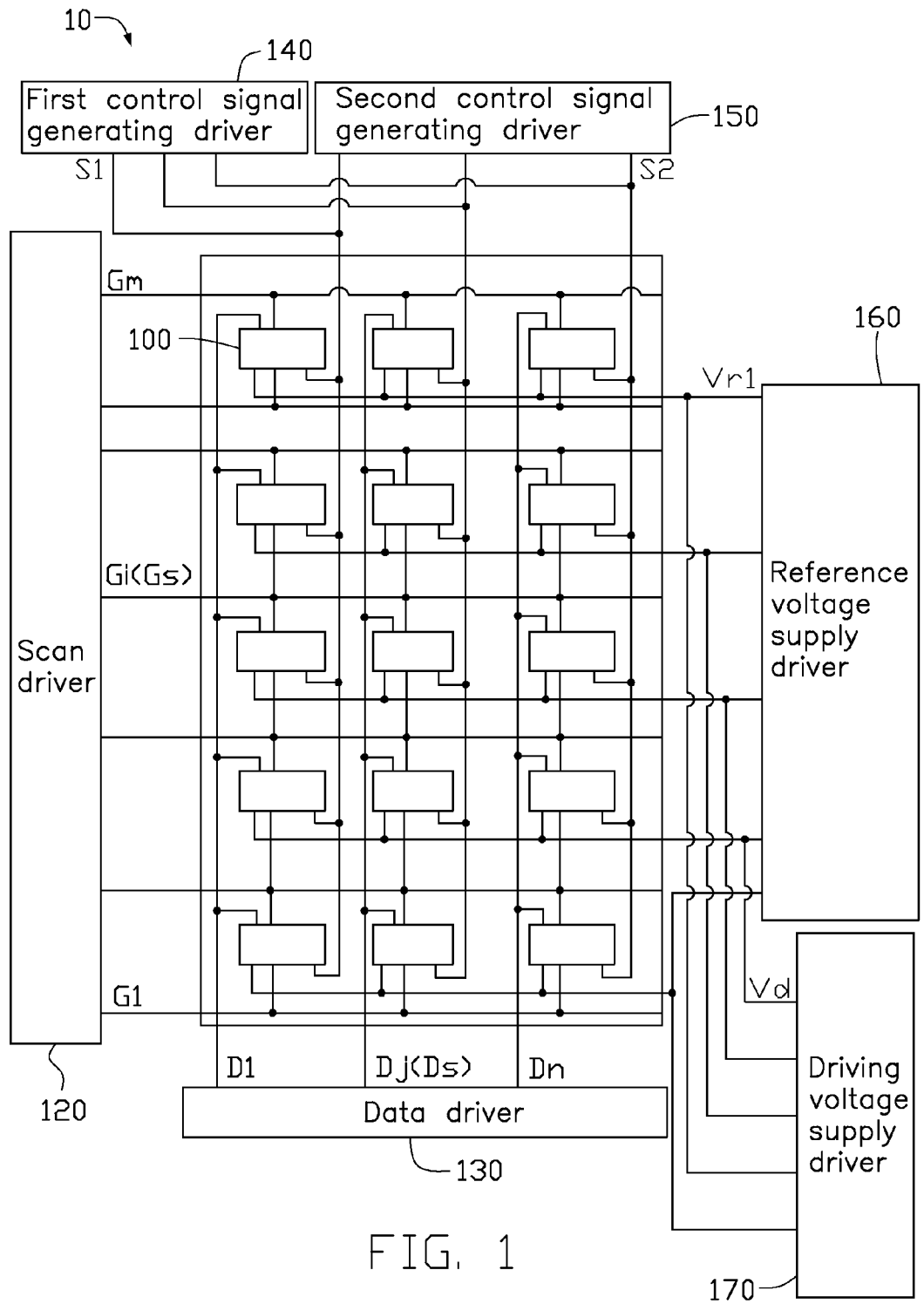
FIG. 1 is a circuit diagram of a first embodiment of an organic light emitting diode display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 illustrates a first embodiment of a structure of an electronic display panel 10. In at least one embodiment, the electronic display panel 10 is an organic light emitting diode (OLED) display panel. The electronic display panel 10 can include a scan driver 120, a data driver 130, a first control signal generating driver 140, a second control signal generating driver 150, a reference voltage supply driver 160, a driving voltage supply driver 170, and a plurality of pixel units 100. Each pixel unit 100 can be electrically coupled to the scan driver 120, the data driver 130, the first control signal generating driver 140, the second control signal generating driver 150, the reference voltage supply driver 160, and the driving voltage supply driver 170 to operate in a plurality of time events repeating in sequence.

A plurality of scan lines G1-Gm can extend from the scan driver 120. The scan driver 120 can generate scan signals Gs, and each scan line G1-Gm can transmit the scan signals Gs to corresponding pixel units 100 arranged along the scan line.

A plurality of data lines D1-Dn can extend from the data driver 130. The data driver 130 can generate data signals Ds, and each data line D1-Dn can transmit the data signals Ds to corresponding pixel units 100 arranged along the data line.

A plurality of first control signal lines (not labeled) can extend from the first control signal generating driver 140. The first control signal generating driver 140 can generate first control signals S1, and each first control signal line can transmit the first control signals S1 to corresponding pixel units 100 arranged along the first control signal line.

A plurality of second control signal lines (not labeled) can extend from the second control signal generating driver 150. The second control signal generating driver 150 can generate second control signals S2, and each second control signal line can transmit the second control signals S2 to corresponding pixel units 100 arranged along the second control signal line.

A plurality of reference voltage lines (not labeled) can extend from the reference voltage supply driver 160. The reference voltage supply driver 160 can generate reference voltage signals Vr1, and each reference voltage line can transmit the reference voltage signal Vr1 to corresponding pixel units 100 arranged along the reference voltage line.

A plurality of driving voltage lines (not labeled) can extend from the driving voltage supply driver 170. The driving voltage supply driver 170 can generate a driving voltage Vd, and each driving voltage line can transmit the driving voltage Vd to corresponding pixel units 100 arranged along the driving voltage line.

Figure 2:
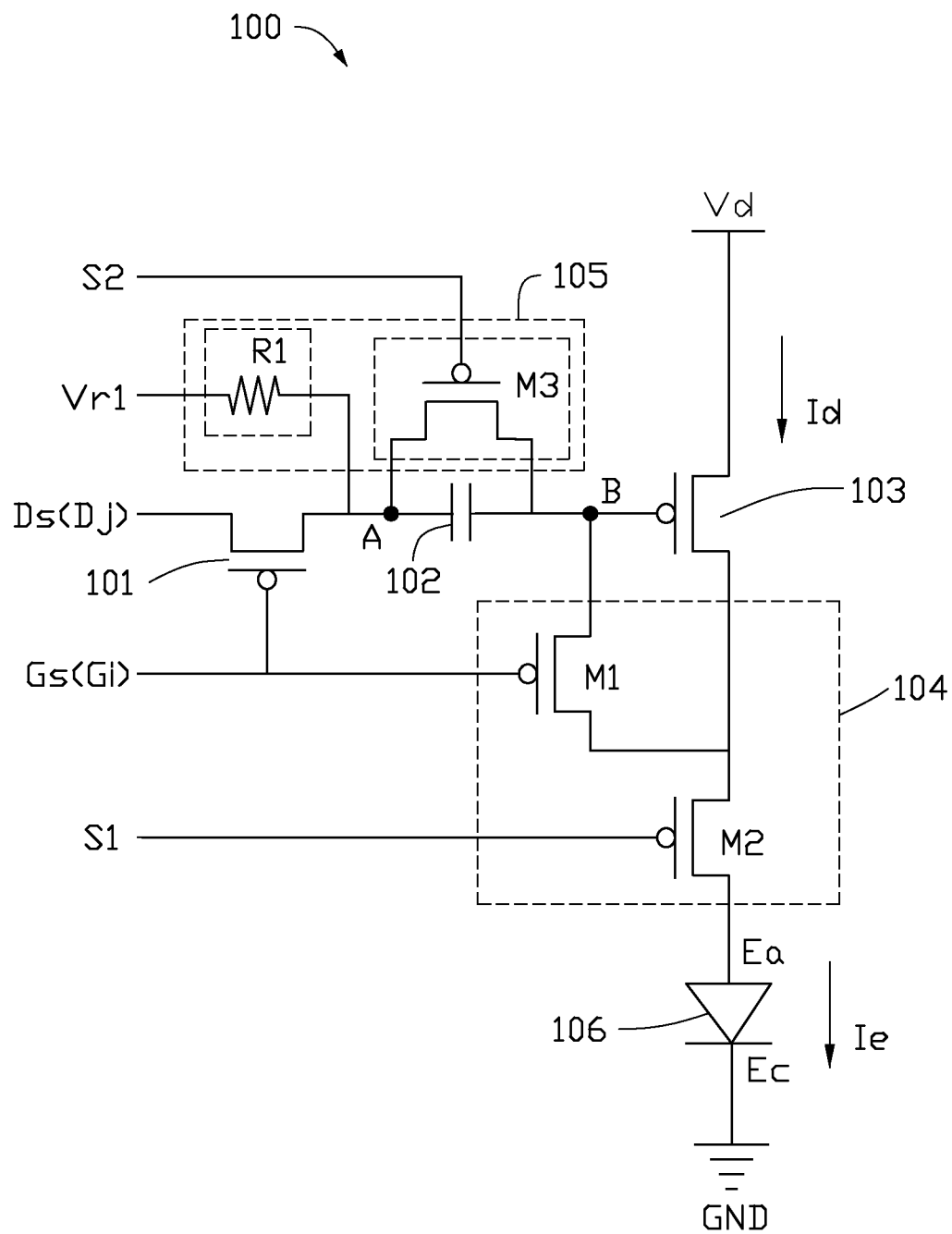
FIG. 2 is a circuit diagram of a pixel unit structure of FIG. 1.

Referring to FIG. 2, each pixel unit 100 can include a switch transistor 101, a storage capacitor 102, a driving transistor 103, a first control circuit 104, a second control circuit 105, and an organic light emitting diode (OLED) 106. The switch transistor 101 can be electrically coupled to the corresponding scan line Gi and the corresponding data line Dj to receive the scan signal Gs and the data signal Ds, respectively. The storage capacitor 102 can receive the data signal Ds from the switch transistor 101. The driving transistor 103 can be electrically coupled to the corresponding driving voltage line to receive the driving voltage Vd. The driving transistor 103 can output a driving current Id to drive the OLED 106 to emit light. The first control circuit 104 is electrically coupled to the scan line Gi and the corresponding first control signal line to receive the scan signal Gs and the first control signal S1, respectively. The second control circuit 105 is electrically coupled to the corresponding reference voltage line and the corresponding second control signal line to receive the reference voltage signal Vr1 and the second control signal S2, respectively. The second control circuit 105 converts the reference voltage signal Vr1 into a discharging reference voltage Vr, and relays the discharging reference voltage Vr to the storage capacitor 102.

The OLED 106 can include an anode terminal Ea and a cathode terminal Ec. The anode terminal Ea can be electrically coupled to the first control circuit 104, and the cathode terminal Ec can be electrically coupled to a ground terminal GND.

A gate electrode of the switch transistor 101 is electrically coupled to the scan line Gi to receive the scan signal Gs. A source electrode of the switch transistor 101 is electrically coupled to the data line Dj to receive the data signal Ds. A drain electrode of the switch transistor 101 is electrically coupled to the storage capacitor 102 to relay the data signal Ds to the storage capacitor 102.

The storage capacitor 102 includes a first connecting terminal A and a second connecting terminal B. The first connecting terminal A is electrically coupled to the drain electrode of the switch transistor 101 to receive the data signal Ds and electrically coupled to the second control circuit 105 to receive the discharging reference voltage Vr. The second connecting terminal B is electrically coupled to the first control circuit 104 and the driving transistor 103.

A gate electrode of the driving transistor 103 is electrically coupled to the second connecting terminal B of the storage capacitor 102 to receive the data signal Ds. A source electrode of the driving transistor 103 is electrically coupled to the driving voltage line to receive the driving voltage Vd from the driving voltage supply driver 170. A drain electrode of the driving transistor 103 is electrically coupled to the first control circuit 104. The data signal Ds and the discharging reference voltage Vr control the driving transistor 103 to be in a conducting state, and the driving transistor 103 in the conducting state is controlled by the driving voltage Vd to output the driving current Id.

The first control circuit 104 includes a first control transistor M1 and a second control transistor M2. A gate electrode of the first control transistor M1 is electrically coupled to the scan line Gi to receive the scan signal Gs from the scan driver 120. A source electrode of the first control transistor M1 is electrically coupled to the second connecting terminal B. A drain electrode of the first control transistor M1 is electrically coupled to the drain electrode of the driving transistor 103. A gate electrode of the second control transistor M2 is electrically coupled to the corresponding first control signal line to receive the first control signal S1 from the first control signal generating driver 140. A source electrode of the second control transistor M2 is electrically coupled to the drain electrode of the driving transistor 103. A drain electrode of the second control transistor M2 is electrically coupled to the OLED 106.

The second control circuit 105 includes a reference resistor R1 and a third control transistor M3. A first end of the reference resistor R1 is electrically coupled to the corresponding reference voltage line to receive the reference voltage Vr1 from the reference voltage signal generating driver 160. A second end of the reference resistor R1 is electrically coupled to the first connecting terminal A. The reference resistor R1 converts the reference voltage signal Vr1 into the discharging reference voltage Vr and relays the discharging reference voltage Vr to the first connecting terminal A. A resistance of the reference resistor R1 is greater than a resistance of the switch transistor 101 for switching from a non-conducting state to a conducting state.

A gate electrode of the third control transistor M3 is electrically coupled to the second control signal line to receive the second control signal S2 from the second control signal generating driver 150. A source electrode of the third control transistor M3 is electrically coupled to the first connecting terminal A. A drain electrode of the third control transistor M3 is electrically coupled to the second connecting terminal B. Electric charge of the storage capacitor 102 is discharged through a conduction path formed by the first connecting terminal A, the third control transistor M3, and the second connecting terminal B in that order.

In at least one embodiment, the reference resistor R1 is made by lightly-doped drain (LDD) doping. A resistance of the switch transistor 101 for switching from a non-conducting state to a conducting state is about 100 kiloohms (k$\Omega$). A resistance of the reference resistor R1 is about 100 megaohms (M$\Omega$).

In at least one embodiment, the switch transistor 101, the driving transistor 103, the first control transistor M1, the second control transistor M2, and the third control transistor M3 are P-channel metal oxide semiconductors. The switch transistor 101 and the first control transistor M1 are in a conducting state upon receiving the scan signal Gs at a low voltage level, and in a non-conducting state upon receiving the scan signal Gs at a high-voltage level. The second control transistor M2 is in a conducting state upon receiving the first control signal S1 at a low voltage level, and in a non-conducting state upon receiving the first control signal at a high voltage level. The third control transistor M3 is in a conducting state upon receiving the second control signal S2 at a low voltage level, and in a non-conducting state upon receiving the second control signal S2 at a high voltage level. The scan signal Gs, the first control signal S1, and the second control signal S2 control the pixel unit 100 to operate in a plurality of time events repeating in sequence.

Figure 3:
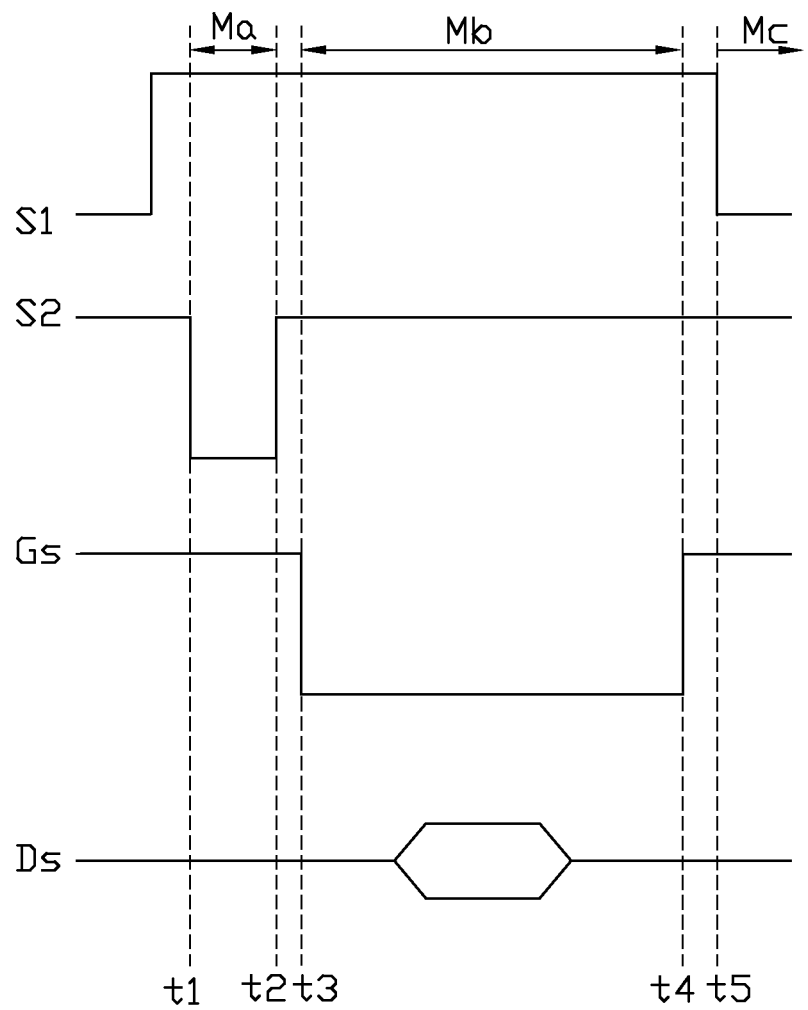
FIG. 3 is a driving sequence diagram of the pixel unit structure of FIG. 2.

Referring to FIG. 3, the plurality of time events of each pixel unit 100 can include five time events.

At a first time event t1, the third control transistor M3 is in the conducting state. Thus, the first connecting terminal A is electrically coupled to the second connecting terminal B through the third control transistor M3. A time period between the first time event t1 and a second time event t2 is a discharge event Ma. During the discharge event Ma, the reference voltage signal Vr1 is converted into the discharging reference voltage Vr and relayed to the first connecting terminal A. The discharging reference voltage Vr is relayed from the first connecting terminal to the second connecting terminal B. Electric charge in the storage capacitor 102 is discharged through the conduction path formed by the first connecting terminal A, the third control transistor M3, and the second connecting terminal B in that order.

At the second time event t2, the third control transistor M3 is controlled by the second control signal S2 to be in the non-conducting state. Thus, the first connecting terminal A is electrically uncoupled from the second connecting terminal B.

At a third time event t3, the switch transistor 101 and the first control transistor M1 are controlled by the scan signal Gs to be in the conducting state. A time period between the third time event t3 and a fourth time event t4 is a data loading event Mb. During the data loading event Mb, the switch transistor 101 receives the data signal Ds and relays the data signal Ds to the first connecting terminal A. Because the resistance of the reference resistor R1 is significantly greater than the resistance of the switch transistor 101, the discharging reference voltage Vr is significantly less than a voltage of the data signal Ds (i.e., Vds), and so the discharging reference voltage Vr can be ignored. Thus, the voltage of the first connecting terminal A is counted as equal to a voltage of the data signal Ds (i.e., Vds). The first control transistor M1 in the conducting state causes the gate electrode and the drain electrode of the driving transistor 103 to be electrically coupled together. A voltage of the second connecting terminal B is equal to the difference between the driving voltage Vd and a threshold voltage Vth of the driving transistor 103, wherein the difference is Vd−Vth. Thus, a voltage difference between the first connecting terminal A and the second connecting terminal B of the storage capacitor 102 is equal to (Vds−(Vd−Vth)). The threshold voltage Vth is equal to the minimum voltage required for the driving transistor 103 to transition from the non-conducting state to the conducting state.

In at least one embodiment, "significantly greater than" and "significantly less than" refer to a difference in value of $10^3$ or higher.

At the fourth time event t4, the switch transistor 101 and the first control transistor M1 are controlled by the scan signal Gs to be in the non-conducting state. Thus, the data signal Ds is stopped from being transmitted to the switch transistor 101.

At a fifth time event t5, the second control transistor M2 is controlled by the first control signal S1 to be in the conducting state. A time period between the fifth time event t5 and the first time event t1 is a display event. During the display event, the first connecting terminal A receives the discharging reference voltage Vr, thereby making the voltage of the first connecting terminal A equal to the discharging reference voltage Vr. The voltage of the second connecting terminal B is equal to (Vr−(Vds−(Vd−Vth))), or (Vr−Vds+Vd−Vth). The driving transistor 103 is controlled by the voltage of the second connecting terminal B to be in a conducting state and controlled by the driving voltage Vd to output the driving current Id. The driving current Id is relayed by the second control transistor M2 to the OLED 106, and the OLED 106 emits light according to the data signal Ds upon receiving the driving current Id. A current Ie flowing through the OLED 106 is directly proportional to $(Vsg−Vth)^2$, wherein Vsg represents the voltage difference between the source electrode and the gate electrode of the driving transistor 103. Thus, Vsg is equal to (Vd−(Vr−Vds+Vd−Vth), or (−Vr+Vds+Vth). Thus, the current Ie flowing through the OLED 106 is directly proportional to $(Vds−Vr)^2$.

Figure 4:
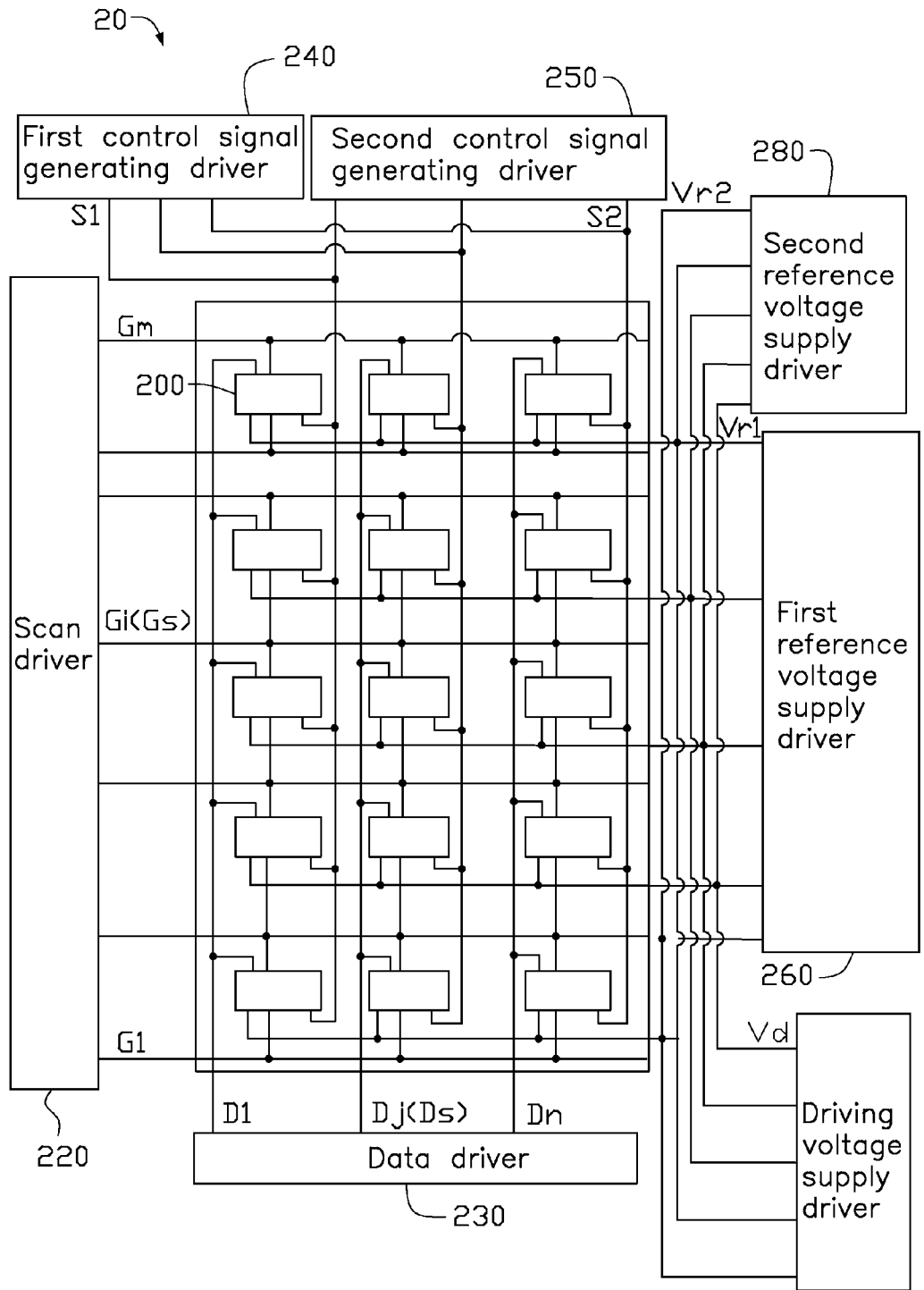
FIG. 4 is a circuit diagram of a second embodiment of an organic light emitting diode display panel.

FIG. 4 illustrates a second embodiment of an electronic display panel 20. In at least one embodiment, the electronic display panel 20 is an organic light emitting diode (OLED) display panel. The electronic display panel 20 can include a scan driver 220, a data driver 230, a first control signal generating driver 240, a second control signal generating driver 250, a first reference voltage supply driver 260, a driving voltage supply driver 270, a second reference voltage supply driver 280, and a plurality of pixel units 200. Each pixel unit 200 can be electrically coupled to the scan driver 220, the data driver 230, the first control signal generating driver 240, the second control signal generating driver 250, the first reference voltage supply driver 260, the driving voltage supply driver 270, and the second reference voltage supply driver 280 to operate in a plurality of time events repeating in sequence.

A plurality of scan lines G1-Gm can extend from the scan driver 220. The scan driver 220 can generate scan signals Gs, and each scan line G1-Gm can transmit the scan signals Gs to corresponding pixel units 200 arranged along the scan line.

A plurality of data lines D1-Dn can extend from the data driver 230. The data driver 230 can generate data signals Ds, and each data line D1-Dn can transmit the data signals Ds to corresponding pixel units 200 arranged along the data line.

A plurality of first control signal lines (not labeled) can extend from the first control signal generating driver 240. The first control signal generating driver 240 can generate first control signals S1, and each first control signal line can transmit the first control signals S1 to corresponding pixel units 200 arranged along the first control signal line.

A plurality of second control signal lines (not labeled) can extend from the second control signal generating driver 250. The second control signal generating driver 250 can generate second control signals S2, and each second control signal line can transmit the second control signals S2 to corresponding pixel units 200 arranged along the second control signal line.

A plurality of first reference voltage lines (not labeled) can extend from the first reference voltage supply driver 260. The first reference voltage supply driver 260 can generate a first reference voltage Vr1, and each first reference voltage line can transmit the first reference voltage Vr1 to corresponding pixel units 200 arranged along the first reference voltage line.

A plurality of driving voltage lines (not labeled) can extend from the driving voltage supply driver 270. The driving voltage supply driver 270 can generate a driving voltage Vd, and each driving voltage line can transmit the driving voltage Vd to corresponding pixel units 200 arranged along the driving voltage line.

A plurality of second reference voltage lines (not labeled) can extend from the second reference voltage supply driver 280. The second reference voltage supply driver 280 can generate a second reference voltage Vr2, and each second reference voltage line can transmit the second reference voltage Vr2 to corresponding pixel units 200 arranged along the second reference voltage line.

Figure 5:
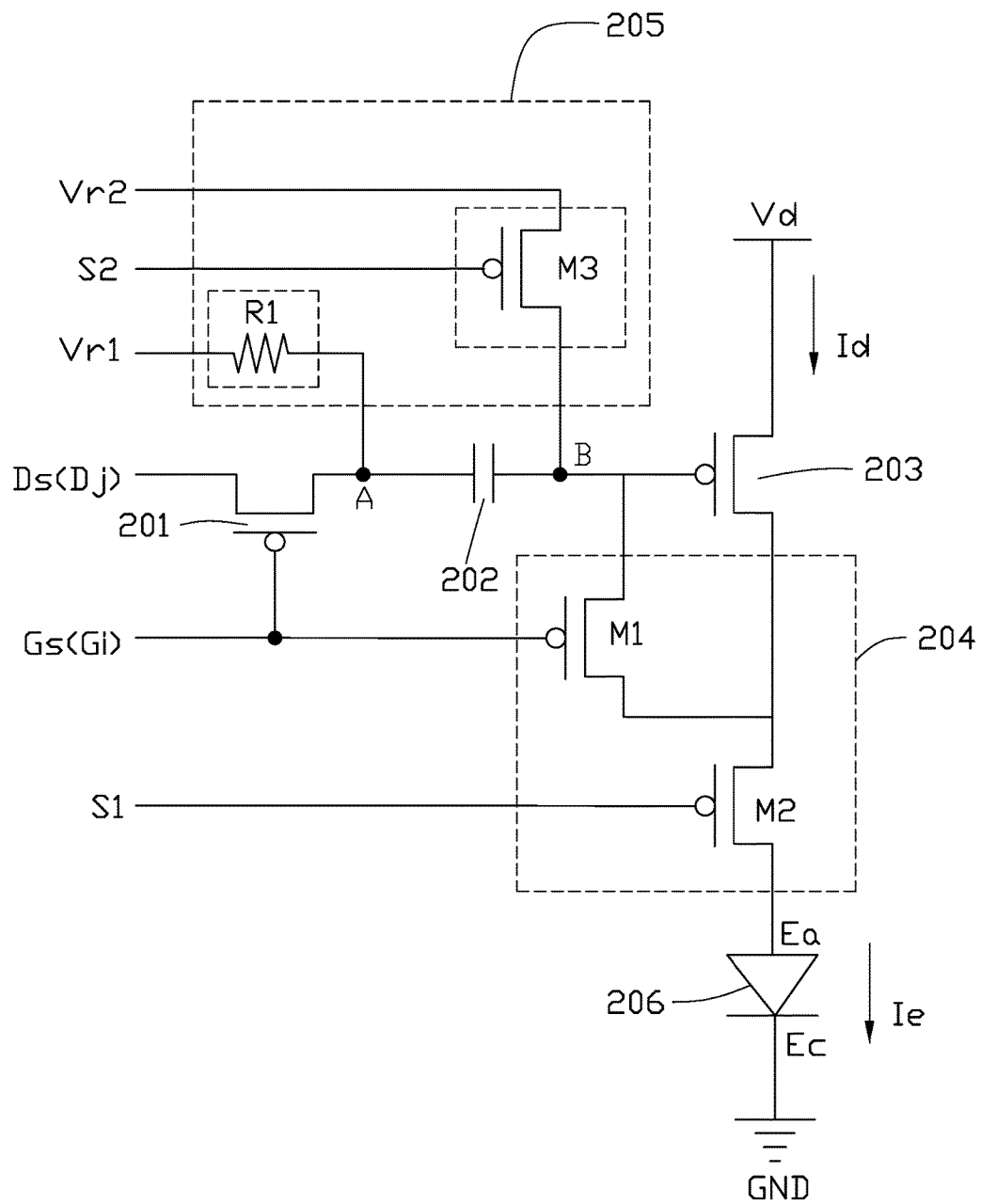
FIG. 5 is a circuit diagram of a pixel unit structure of FIG. 4.

Referring to FIG. 5, each pixel unit 200 can include a switch transistor 201, a storage capacitor 202, a driving transistor 203, a first control circuit 204, a second control circuit 205, and an organic light emitting diode (OLED) 206. The switch transistor 201 can be electrically coupled to the corresponding scan line Gi and the corresponding data line Dj to receive the scan signal Gs and the data signal Ds, respectively. The storage capacitor 202 can receive the data signal Ds from the switch transistor 201. The driving transistor 203 can be electrically coupled to the corresponding driving voltage line to receive the driving voltage Vd. The driving transistor 203 can output a driving current Id to drive the OLED 206 to emit light. The first control circuit 204 is electrically coupled to the scan line Gi and the corresponding first control signal line to receive the scan signal Gs and the first control signal S1, respectively. The second control circuit 205 is electrically coupled to the corresponding first reference voltage line, the corresponding second control signal line, and the corresponding second reference voltage line to receive the first reference voltage Vr1, the second control signal S2, and the second reference voltage Vr2, respectively. The second control circuit 105 converts the first reference voltage Vr1 into the discharging reference voltage Vr and relays the discharging reference voltage Vr to the storage capacitor 202. In at least one embodiment, the second reference voltage Vr2 is less than the discharging reference voltage Vr.

The OLED 206 can include an anode terminal Ea and a cathode terminal Ec. The anode terminal Ea can be electrically coupled to the first control circuit 204, and the cathode terminal Ec can be electrically coupled to a ground terminal GND.

A gate electrode of the switch transistor 201 is electrically coupled to the scan line Gi to receive the scan signal Gs. A source electrode of the switch transistor 201 is electrically coupled to the data line Dj to receive the data signal Ds. A drain electrode of the switch transistor 201 is electrically coupled to the storage capacitor 202 to relay the data signal Ds to the storage capacitor 202.

The storage capacitor 202 includes a first connecting terminal A and a second connecting terminal B. The first connecting terminal A is electrically coupled to the drain electrode of the switch transistor 201 to receive the data signal Ds and electrically coupled to the second control circuit 205 to receive the discharging reference voltage Vr. The second connecting terminal B is electrically coupled to the first control circuit 204 and the driving transistor 203.

A gate electrode of the driving transistor 203 is electrically coupled to the second connecting terminal B of the storage capacitor 202 to receive the data signal Ds. A source electrode of the driving transistor 203 is electrically coupled to the driving voltage line to receive the driving voltage Vd from the driving voltage supply driver 270. A drain electrode of the driving transistor 203 is electrically coupled to the first control circuit 204. The data signal Ds and the discharging reference voltage Vr control the driving transistor 203 to be in a conducting state, and the driving transistor 203 in the conducting state is controlled by the driving voltage Vd to output the driving current Id.

The first control circuit 204 includes a first control transistor M1 and a second control transistor M2. A gate electrode of the first control transistor M1 is electrically coupled to the scan line Gi to receive the scan signal Gs from the scan driver 220. A source electrode of the first control transistor M1 is electrically coupled to the second connecting terminal B. A drain electrode of the first control transistor M1 is electrically coupled to the drain electrode of the driving transistor 203. A gate electrode of the second control transistor M2 is electrically coupled to the corresponding first control signal line to receive the first control signal S1 from the first control signal generating driver 240. A source electrode of the second control transistor M2 is electrically coupled to the drain electrode of the driving transistor 203. A drain electrode of the second control transistor M2 is electrically coupled to the OLED 206.

The second control circuit 205 includes a reference resistor R1 and a third control transistor M3. A first end of the reference resistor R1 is electrically coupled to the corresponding first reference voltage line to receive the first reference voltage Vr1 from the first reference voltage supply driver 260. A second end of the reference resistor R1 is electrically coupled to the first connecting terminal A. The reference resistor R1 converts the first reference voltage Vr1 into the discharging reference voltage Vr and relays the discharging reference voltage Vr to the first connecting terminal A. A resistance of the reference resistor R1 is greater than a resistance of the switch transistor 201 for switching from a non-conducting state to a conducting state. A gate electrode of the third control transistor M3 is electrically coupled to the second control signal line to receive the second control signal S2 from the second control signal generating driver 250. A source electrode of the third control transistor M3 is electrically coupled to the second reference voltage line to receive the second reference voltage Vr2 from the second reference voltage supply driver 280. A drain electrode of the third control transistor M3 is electrically coupled to the second connecting terminal B. Electric charge of the storage capacitor 202 is discharged through a conduction path formed by the first connecting terminal A, the second connecting terminal B, and the third control transistor M3 in that order.

In at least one embodiment, the reference resistor R1 is made by LDD doping. A resistance of the switch transistor 201 for switching from a non-conducting state to a conducting state is about 100 kiloohms (kΩ). A resistance of the reference resistor R1 is about 100 megaohms (MΩ).

In at least one embodiment, the switch transistor 201, the driving transistor 203, the first control transistor M1, the second control transistor M2, and the third control transistor M3 are P-channel metal oxide semiconductors. The switch transistor 201 and the first control transistor M1 are in a conducting state upon receiving the scan signal Gs at a low voltage level, and in a non-conducting state upon receiving the scan signal Gs at a high-voltage level. The second control transistor M2 is in a conducting state upon receiving the first control signal S1 at a low voltage level, and in a non-conducting state upon receiving the first control signal at a high voltage level. The third control transistor M3 is in a conducting state upon receiving the second control signal S2 at a low voltage level, and in a non-conducting state upon receiving the second control signal S2 at a high voltage level. The scan signal Gs, the first control signal S1, and the second control signal S2 control the pixel unit 200 to operate in a plurality of time events repeating in sequence.

Figure 6:
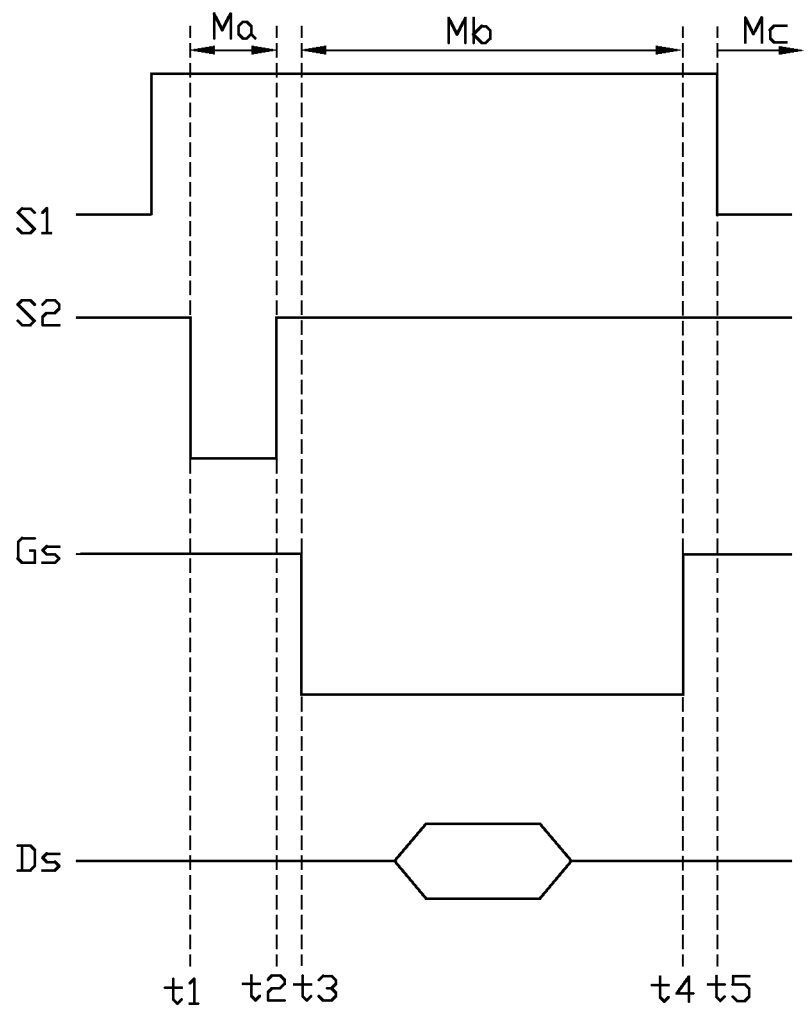
FIG. 6 is a driving sequence diagram of the pixel unit structure of FIG. 5.

Referring to FIG. 6, the plurality of time events of each pixel unit 200 can include five time events.

At a first time event t1, the third control transistor M3 is in the conducting state. A time period between the first time event t1 and a second time event t2 is a discharge event Ma. During the discharge event Ma, the first reference voltage Vr1 is converted into the discharging reference voltage Vr and relayed to the first connecting terminal A. The third control transistor M3 receives the second reference voltage Vr2 from the second reference voltage supply driver 280. Because the second reference voltage Vr2 is less than the discharging reference voltage Vr, electric charge in the storage capacitor 202 is discharged through the conduction path formed by the first connecting terminal A, the second connecting terminal B, and the third control transistor M3 in that order.

At the second time event t2, the third control transistor M3 is controlled by the second control signal S2 to be in the non-conducting state. Thus, the first connecting terminal A is electrically uncoupled from the second connecting terminal B.

At a third time event t3, the switch transistor 201 and the first control transistor M1 are controlled by the scan signal Gs to be in the conducting state. A time period between the third time event t3 and a fourth time event t4 is a data loading event Mb. During the data loading event Mb, the switch transistor 201 receives the data signal Ds and relays the data signal Ds to the first connecting terminal A. Because the resistance of the reference resistor R1 is significantly greater than the resistance of the switch transistor 201, the discharging reference voltage Vr is significantly less than a voltage of the data signal Ds (i.e., Vds), and so the discharging reference voltage Vr can be ignored. Thus, the voltage of the first connecting terminal A is counted as equal to a voltage of the data signal Ds (i.e., Vds). The first control transistor M1 in the conducting state causes the gate electrode and the drain electrode of the driving transistor 203 to be electrically coupled together. A voltage of the second connecting terminal B is equal to the difference between the driving voltage Vd and a threshold voltage Vth of the driving transistor 203, wherein the difference is Vd−Vth. Thus, a voltage difference between the first connecting terminal A and the second connecting terminal B of the storage capacitor 202 is equal to (Vds−(Vd−Vth)). The threshold voltage Vth is equal to the minimum voltage required for the driving transistor 203 to transition from the non-conducting state to the conducting state.

In at least one embodiment, "significantly greater than" and "significantly less than" refer to a difference in value of $10^3$ or higher.

At the fourth time event t4, the switch transistor 201 and the first control transistor M1 are controlled by the scan signal Gs to be in the non-conducting state. Thus, the data signal Ds is stopped from being transmitted to the switch transistor 201.

At a fifth time event t5, the second control transistor M2 is controlled by the first control signal S1 to be in the conducting state. A time period between the fifth time event t5 and the first time event t1 is a display event. During the display event, the first connecting terminal A receives the discharging reference voltage Vr, thereby making the voltage of the first connecting terminal A equal to the discharging reference voltage Vr. The voltage of the second connecting terminal B is equal to (Vr−(Vds−(Vd−Vth))), or (Vr−Vds+Vd−Vth). The driving transistor 203 is controlled by the voltage of the second connecting terminal B to be in a conducting state and controlled by the driving voltage Vd to output the driving current Id. The driving current Id is relayed by the second control transistor M2 to the OLED 206, and the OLED 206 emits light according to the data signal Ds upon receiving the driving current Id. A current Ie flowing through the OLED 206 is directly proportional to $(Vsg-Vth)^2$, wherein Vsg represents the voltage difference between the source electrode and the gate electrode of the driving transistor 203. Thus, Vsg is equal to (Vd−(Vr−Vds+Vd−Vth), or (−Vr+Vds+Vth). Thus, the current Ie flowing through the OLED 206 is directly proportional to $(Vds-Vr)^2$.

For the first and second embodiments of the electronic display panel 10, 20, the time events t1-t5 repeat in sequence for each pixel unit 100, 200, thereby ensuring accurate storage of the data signals Ds. The current Ie flowing through the OLED 106, 206 is related to the voltage of the data signal Ds and the discharging reference voltage Vr, so the current Ie flowing through the OLED 106, 206 is not fluctuated by the threshold voltage Vth or the driving voltage Vd of the driving transistor 103, 203. Furthermore, the discharging reference voltage Vr supplied to different pixel units 100, 200 is the same, so even when the driving voltage Vd supplied to the pixel units 100, 200 fluctuates, an image display quality of the electronic display panel 10, 20 is improved. In addition, the reference resistor R1 can be made by LDD doping to reduce a required size of the reference resistor R1, thereby saving space of the electronic display panels 10, 20.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A pixel unit structure of an organic light emitting diode display panel, the pixel unit structure comprising:
   a switch transistor configured to receive a scan signal from a scan driver, and configured to receive a data signal from a data driver;
   a storage capacitor comprising a first connecting terminal and a second connecting terminal, the switch transistor electrically coupled to the first connecting terminal, the storage capacitor configured to receive the data signal from the switch transistor and receive a discharging reference voltage;
   a driving transistor electrically coupled to the second connecting terminal and configured to receive a driving voltage from a driving voltage supply driver, and output a driving current for driving an organic light emitting diode to emit light;
   a first control circuit comprises a first control transistor and a second control transistor and electrically coupled to the second connecting terminal and the driving transistor, the first control circuit configured to receive a first control signal from a first control signal generating driver and receive the scan signal, and relay the driving current from the driving transistor to the organic light emitting diode based on the first control signal and the scan signal; and
   a second control circuit comprises a third control transistor and a reference voltage converter, and electrically coupled to the first connecting terminal, the third control transistor configured to receive a second control signal from a second control signal generating driver, and the reference voltage converter configured to receive a reference voltage from a reference voltage supply driver, convert the reference voltage into the discharging reference voltage, relay the discharging reference voltage to the storage capacitor via the first connecting terminal, and provide a discharge path for the storage capacitor through the third control transistor;
   the organic light emitting diode electrically coupled to the first control circuit and configured to emit light according to the data signal;
   wherein the organic light emitting diode is controlled by the driving transistor and the first control circuit to emit light;
   wherein the scan signal, the first control signal, the second control signal, and the discharging reference voltage control the pixel unit to operate in a plurality of time events repeating in sequence, each time event corresponding to a change in state of the pixel unit controlled by the scan signal, the first control signal, the second control signal, and/or the discharging reference voltage; and
   wherein a source electrode of the third control transistor is electrically coupled to the first connecting terminal; a drain electrode of the third control transistor is electrically coupled to the second connecting terminal.

2. The pixel unit structure as in claim 1, wherein:
   the organic light emitting diode comprises an anode terminal electrically coupled to the first control circuit and the driving transistor, and comprises a cathode terminal electrically coupled to ground;
   a gate electrode of the switch transistor is electrically coupled to a scan line to receive the scan signal from the scan driver;
   a source electrode of the switch transistor is electrically coupled to a data line to receive the data signal from the data driver;
   a drain electrode of the switch transistor is electrically coupled to the storage capacitor to relay the data signal to the storage capacitor;
   the storage capacitor comprises a first connecting terminal and a second connecting terminal;

the first connecting terminal is electrically coupled to the drain electrode of the switch transistor to receive the data signal, and electrically coupled to the second control circuit to receive the discharging reference voltage;

the second connecting terminal is electrically coupled to the driving transistor and the first control circuit; a gate electrode of the driving transistor is electrically coupled to the second connecting terminal of the storage capacitor;

a source electrode of the driving transistor is electrically coupled to a driving voltage line to receive the driving voltage from the driving voltage supply driver;

a drain electrode of the driving transistor is electrically coupled to the first control circuit;

the data signal and the discharging reference voltage control the driving transistor to be in a conducting state, and the driving transistor in the conducting state is controlled by the driving voltage to output the driving current;

a gate electrode of the first control transistor is electrically coupled to the scan line to receive the scan signal from the scan driver;

a source electrode of the first control transistor is electrically coupled to the second connecting terminal;

a drain electrode of the first control transistor is electrically coupled to the drain electrode of the driving transistor;

a gate electrode of the second control transistor is electrically coupled to a first control signal line to receive the first control signal from the first control signal generating driver;

a source electrode of the second control transistor is electrically coupled to the drain electrode of the driving transistor;

a drain electrode of the second control transistor is electrically coupled to the organic light emitting diode;

the second control circuit comprises a reference resistor;

a first end of the reference resistor is electrically coupled to a reference voltage line to receive the reference voltage from the reference voltage supply driver;

a second end of the reference resistor is electrically coupled to the first connecting terminal;

the reference resistor converts the reference voltage into the discharging reference voltage, and relays the discharging reference voltage to the first connecting terminal;

a resistance of the reference resistor is greater than a resistance of the switch transistor for switching from a non-conducting state to a conducting state;

a gate electrode of the third control transistor is electrically coupled to a second control signal line to receive the second control signal from the second control signal generating driver; and electric charge of the storage capacitor is discharged through a conduction path formed by the first connecting terminal, the third control transistor, and the second connecting terminal in that order.

3. The pixel unit structure as in claim 2, wherein:

the switch transistor, the driving transistor, the first control transistor, the second control transistor, and the third control transistor are P-channel metal oxide semiconductors;

the switch transistor and the first control transistor are in a conducting state upon receiving the scan signal at a low voltage level, and in a non-conducting state upon receiving the scan signal at a high voltage level;

the second control transistor is in a conducting state upon receiving the first control signal at a low voltage level, and in a non-conducting state upon receiving the first control signal at a high voltage level;

the third control transistor is in a conducting state upon receiving the second control signal at a low voltage level, and in a non-conducting state upon receiving the second control signal at a high voltage level; and the scan signal, the first control signal, and the second control signal control the pixel unit to operate in five time events repeating in sequence.

4. The pixel unit structure as in claim 3, wherein at a first time event:

the third control transistor is in the conducting state;

the first connecting terminal is electrically coupled to the second connecting terminal through the third control transistor;

the reference voltage is converted into the discharging reference voltage and relayed to the first connecting terminal;

the discharging reference voltage is relayed from the first connecting terminal to the second connecting terminal; and electric charge in the storage capacitor is discharged through the conduction path formed by the first connecting terminal, the third control transistor, and the second connecting terminal.

5. The pixel unit structure as in claim 4, wherein at a second time event:

the third control transistor is in the non-conducting state; and the first connecting terminal is electrically uncoupled from the second connecting terminal.

6. The pixel unit structure as in claim 5, wherein at a third time event:

the switch transistor and the first control transistor are controlled by the scan signal to be in a conducting state;

the switch transistor in the conducting state receives the data signal;

the data signal is relayed from the switch transistor to the first connecting terminal to make a voltage of the first connecting terminal equal to the voltage of the data signal;

the first control transistor in the conducting state causes the gate electrode and the drain electrode of the driving transistor to be electrically coupled together; and a voltage of the second connecting terminal is equal to the difference between the driving voltage and a threshold voltage of the driving transistor.

7. The pixel unit structure as in claim 6, wherein at a fourth time event, the switch transistor and the first control transistor are controlled by the scan signal to be in a non-conducting state, and the data signal is stopped being transmitted to the switch transistor.

8. The pixel unit structure as in claim 7, wherein at a fifth time event:

the second control transistor is controlled by the first control signal to be in a conducting state;

the discharging reference voltage is relayed to the first connecting terminal to make the voltage of the first connecting terminal equal to the discharging reference voltage;

the voltage of the second connecting terminal is equal to the sum of the difference between the discharging reference voltage and the voltage of the data signal and the difference between the driving voltage and the threshold voltage of the driving transistor;

the driving transistor is controlled by the voltage of the second connecting terminal to be in a conducting state and controlled by the driving voltage to output the driving current;

the driving current is relayed by the second control transistor to the organic light emitting diode; and the organic light emitting diode, upon receiving the driving current, emits light; and a current passing through the organic light emitting diode is directly proportional to the square of the difference between the voltage of the data signal and the discharging reference voltage.

* * * * *